United States Patent
Ogura et al.

(10) Patent No.: US 6,636,439 B1
(45) Date of Patent: Oct. 21, 2003

(54) FAST PROGRAM TO PROGRAM VERIFY METHOD

(75) Inventors: Seiki Ogura, Wappingers Falls, NY (US); Tomoko Ogura, Fishkill, NY (US); Nori Ogura, Wappingers Falls, NY (US)

(73) Assignee: Halo, LSI, INc., Wappingers Falls, NY (US)

( * ) Notice: Subject to any disclaimer, the term of this patent is extended or adjusted under 35 U.S.C. 154(b) by 0 days.

(21) Appl. No.: 10/371,840

(22) Filed: Feb. 20, 2003

Related U.S. Application Data

(62) Division of application No. 10/016,916, filed on Dec. 14, 2001, now Pat. No. 6,549,463.
(60) Provisional application No. 60/255,824, filed on Dec. 15, 2000.

(51) Int. Cl.$^7$ ........................... G11C 16/04; G11C 16/06
(52) U.S. Cl. ..................... 365/185.18; 365/185.03; 365/185.14; 365/185.21; 365/185.22; 365/185.24; 365/185.26; 365/185.27; 365/185.28
(58) Field of Search .................. 365/185.18, 185.03, 365/185.14, 185.21, 185.22, 185.24, 185.26, 185.27, 185.28

(56) References Cited

U.S. PATENT DOCUMENTS

| | | | | |
|---|---|---|---|---|
| 5,694,356 A | * | 12/1997 | Wong et al. | 365/185.03 |
| 5,784,327 A | * | 7/1998 | Hazani | 365/218 |
| 6,002,152 A | * | 12/1999 | Guterman et al. | 257/316 |
| 6,011,725 A | | 1/2000 | Eitan | 365/185.33 |
| 6,248,633 B1 | | 6/2001 | Ogura et al. | 438/267 |

* cited by examiner

*Primary Examiner*—David Nelms
*Assistant Examiner*—Ly Duy Pham
(74) *Attorney, Agent, or Firm*—Geroge O. Saile; Stephen B. Ackerman

(57) ABSTRACT

In the present invention a new method for program and program verify is described. The threshold voltage of the memory cell is shifted up and then measured with minimal charging and discharging of the bit lines and control gate lines. Bit line to control gate line capacitance is also used to reduce the number of voltage references needed. Program current is reduced by use of a load device coupled to the source diffusion. The result is increased program bandwidth with lower high voltage charge pump current consumption.

5 Claims, 8 Drawing Sheets

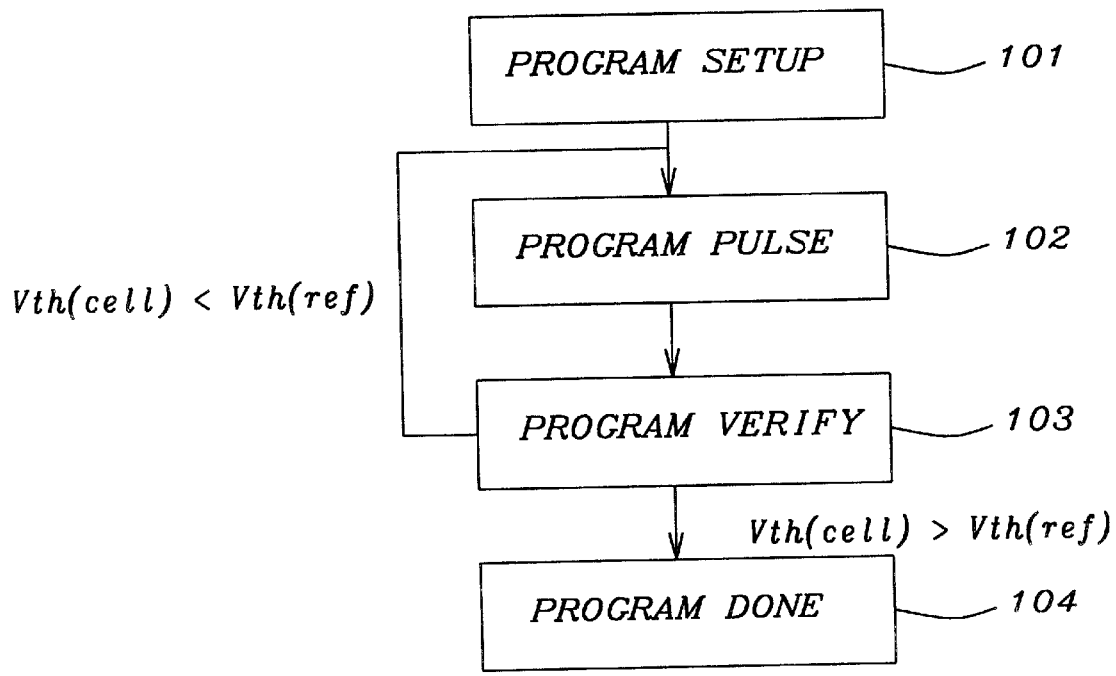
FIG. 1 – Prior Art
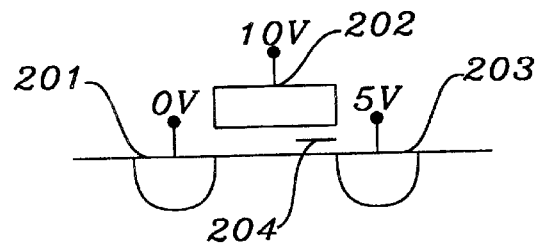
FIG. 2A – Prior Art
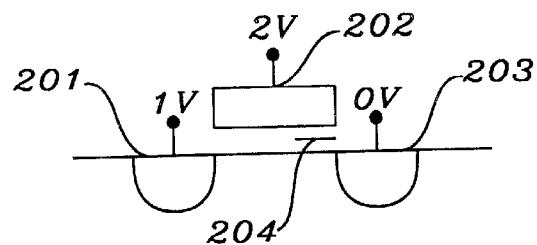
FIG. 2B – Prior Art

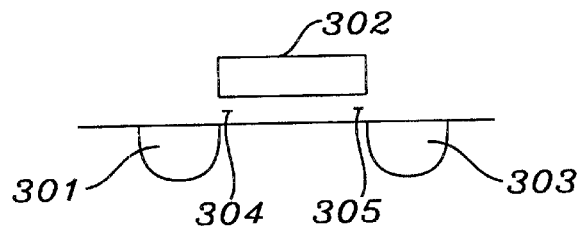
FIG. 3 — Prior Art
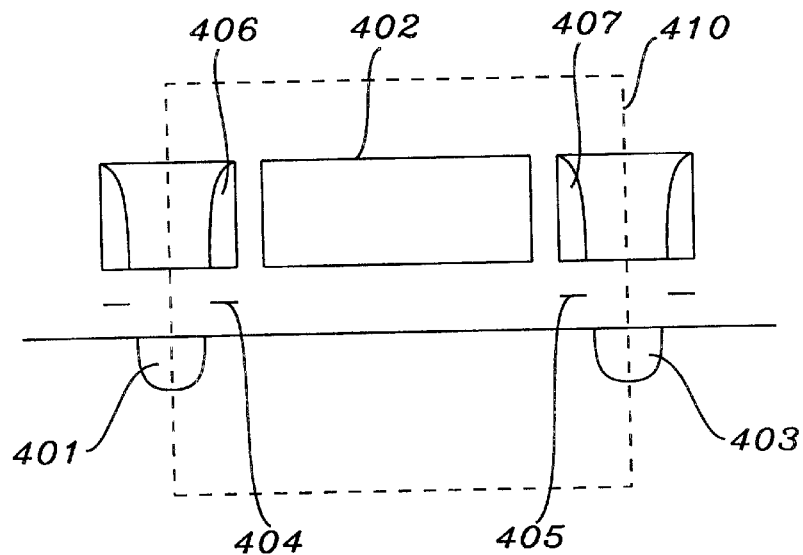
FIG. 4A — Prior Art
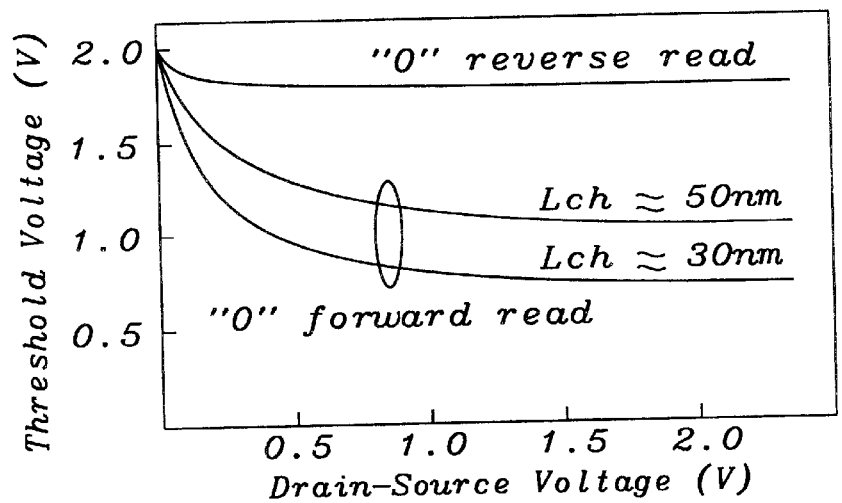
FIG. 4B — Prior Art

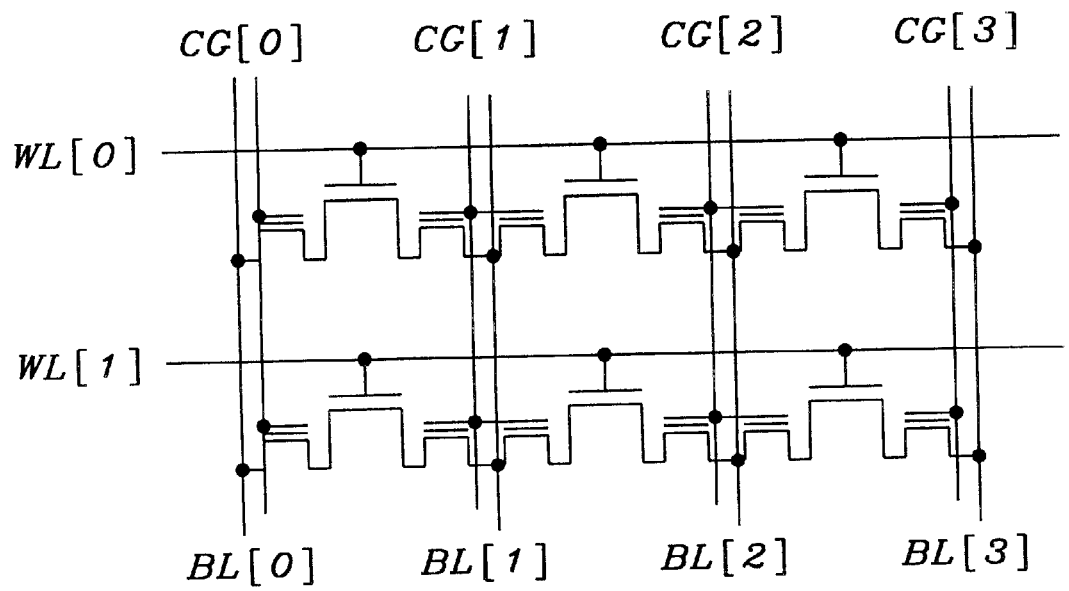
FIG. 4C – Prior Art
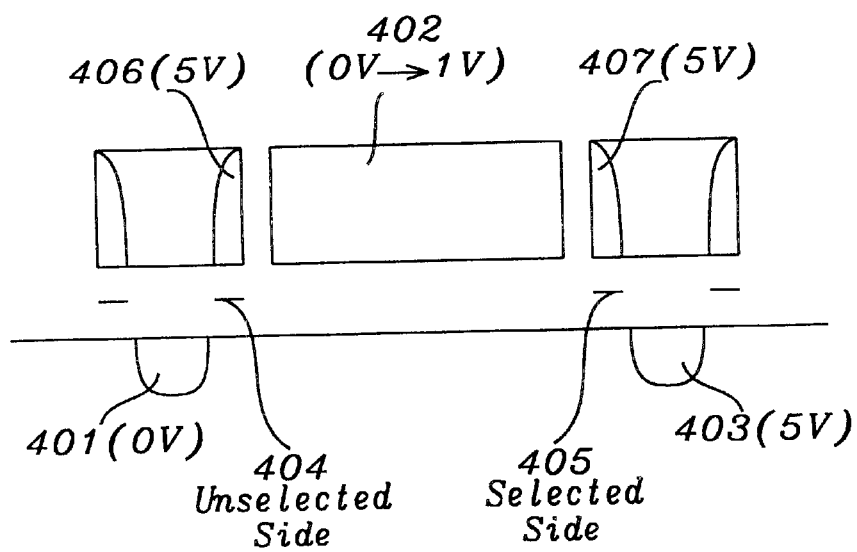
FIG. 5A

FAST PROGRAM TO PROGRAM VERIFY METHOD

This is a division of patent application Ser. No. 10/016,916, filing date Dec. 14, 2001 now U.S. Pat. No. 6,549,463, Fast Program To Program Verify Method, assigned to the same assignee as the present invention.

This application claims priority to Provisional Patent Application serial No. 60/255,824, filed on Dec. 15, 2000, which is herein incorporated by reference.

BACKGROUND OF THE INVENTION

1. Field of Invention

The present invention is related to semiconductor non-volatile memory and in particular to program and program verify for twin MONOS flash memories.

2. Description of Related Art

In MONOS flash memory devices, data is stored as electrons in the nitride region of an oxide-nitride-oxide (ONO) composite layer under a control gate. The presence of electrons in the nitride region increases the threshold of the device. An erased cell with a logical "1" stored has few or no stored electrons in the nitride region, and a programmed cell with a logical "0" stored has a fixed range of electrons in the nitride region. In conventional MONOS memories, the program operation is interrupted by program verify cycles in order to control the number of electrons in the nitride region. A state diagram of prior art for a program operation with program verify is shown in FIG. 1. In the first program setup 101 is needed to startup the charge pumps and setup the voltages needed for the program operation. The selected memory cell is subjected to program voltage conditions during the program pulse step 102. After a fixed time, the threshold of the memory cell is tested in the program verify step 103. If the threshold of the memory cell is greater than the reference threshold, then the memory cell is deemed to have been programmed, and program is complete 104. Otherwise if the threshold of the selected memory cell is not high enough, then the memory cell is placed back into the program state 102.

FIG. 2a gives an example of voltage conditions of a MONOS memory cell of prior art for program and for program verify of prior art in FIG. 2b. The memory cell is composed of a control gate 202, a source 201 and a drain 203. Electrons are stored in the nitride region 204 under the control gate 202. It should be noted that the voltages that are shown are an example only. Actual voltages depend on many specifications such as program speed, oxide thickness, and memory cell dimensions. For CHE (channel hot electron) injection program, a voltage of approximately 10V is applied to the control gate 202 and another high voltage of approximately 5V is applied to the drain 203 with the source 201 grounded.

Referring to FIG. 2b, program verify is very similar to a read operation, in that one diffusion will be measured with respect to a reference to determine the memory state. The control gate 202 is biased to approximately 2V, the drain 201 is biased to approximately 1V and the source 203 is biased to 0V. Whenever there is a transition between program and program verify states, it is necessary to swap the source and drains and to lower the drain 203 voltage from 5V to 0V. If another program cycle is necessary, the drain 203 is raised to 5V again. This is an inefficient usage of charge, because extra current is needed to raise and lower the drain voltage between program and program verify cycles. When the drains of many memory cells are connected to a single highly capacitive bit line, the transition time between program and program verify increases. This increased transition time increases the overall program operation time.

FIG. 3 shows a prior art dual storage MONOS memory device (called NROM) in which there are two memory storage sites 304 and 305 within one memory cell, described in U.S. Pat. No. 6,011,725 (Eitan), which is directed to a method of read described called "reverse read". The diffusion 303, which is closest to the selected memory storage region 305, becomes the lower voltage or source whereas the diffusion 301, which is opposite the selected memory storage region 305, becomes the higher voltage or drain. The drain voltage is higher than the source voltage in order to create a depletion region into the substrate and thus "override" the charge that may be stored in the unselected memory storage region, if it is in the high threshold "0" memory state. This type of NROM memory cell can only operate in reverse read mode, because a higher voltage is needed on the unselected memory storage side to override the unselected memory channel. If the device were to be read in the forward direction, then the higher drain voltage would override the selected memory storage side, and the cell would always be sensed to be in a low Vt "1" memory state.

Another prior art dual storage MONOS device is described in patent application Ser. No. 09/426,692, filed Oct. 25, 1999, called the twin MONOS cell and shown in FIG. 4a. In this type of memory cell there are two extra side wall polysilicon control gate structures 406 and 407 in addition to the word gate 402 and two diffusions 401 and 403. Unlike the control gate 302 of FIG. 3, the word gate 402 of FIG. 4a does not have memory nitride storage regions underneath itself. Instead, the memory storage regions lie underneath the side wall polysilicon control gates 406 and 407. As shown in FIG. 4a, two side wall polysilicon gates between two adjacent memory cells are electrically connected together to define one equivalent control gate. Because the additional control gates 406 and 407 provide another level of flexibility, the twin MONOS cell can be easily read in both the reverse and forward directions. The channel underneath of the unselected nitride storage site can be overridden by increasing the voltage of the associated control gate to a voltage which is some delta above the highest possible threshold voltage (Vcg override). Although the twin MONOS cell is able to read in both directions, the forward read has slower read performance, due to lower cell current, smaller threshold margins, and limited voltage range. FIG. 4b shows the relationship of drain voltage v.s. the threshold of the selected nitride region for memory nitride channel lengths of >50 nm and <50 nm. It can be seen that during forward read, the high Vt cell ("0") suffers degradation of threshold at higher drain-source voltages. This effect becomes more severe for shorter channel lengths. Thus it is desirable to keep the drain voltage to lower than approximately 0.3~0.5V during sensing in order to maintain reasonable threshold margin between the "1" and "0" cell.

FIG. 4c is a schematic representation of the twin MONOS cell array in the diffusion bit configuration. Each memory cell consists of one word gate, two control gate halves, under which each control gate half is one nitride storage region, and two diffusion halves. In this array, memory cells are arranged in rows and columns, in which word gates are horizontally connected together by word lines WL[0–1], and bit diffusions are vertically connected together by bit lines BL[0–3], and control gates are vertically connected together by control lines CG[0–3]. Control lines CG[0–3] and bit lines BL[0–3] may run atop of one another and have a coupling capacitance of about 30%.

For high bandwidth program applications, it is desirable to program many memory cells in parallel. If many bit lines and control lines are need to be charged and discharged between program and program verify cycles, the voltage and current requirements of the charge pumps and voltage regulators will be very high, which impacts power and overall program time. In multi-level storage memories especially, the number of program and program verify cycles is greater in order to have tighter control between threshold states. Thus it is desirable to minimize the voltage transitions between program and program verify.

SUMMARY OF THE INVENTION

It is an objective of the present invention to provide a low power method of programming a dual storage site MONOS memory cell.

It is also an objective of the present invention to provide a method of program verify for a dual storage site MONOS memory cell.

It is still an objective of the present invention to efficiently switch between program and program verify operations.

It is another objective of the present invention to minimize transition between program and program verify by minimizing the charging and discharging the diffusion bit line.

It is another objective of the present invention to minimize transition between program and program verify by minimizing the charging and discharging of control gate voltages.

It is another objective of the present invention to minimize the number of reference voltages required for program and program verify.

It is also another objective of the present invention to use forward read for program verify.

It is also another objective of the present invention to use reverse read for program verify.

It is another objective of the present invention to use capacitive coupling between the control gate line and the bit line in order to achieve a target threshold voltage by minimal voltage application to the control lines and bit lines.

It is another objective of the present invention to protect the adjacent cell from program disturb.

It is still another objective of the present invention to control program cell current by connecting a load transistor to the source diffusion.

It is yet an objective of the present invention to maintain control gate voltages for program and program verify to be the same.

In the present invention a method to produce a fast switch between program and program verify is described for a MONOS memory device. The word gate of the cell to be programmed is biased to a low voltage to limit memory cell current to a few microamperes. The drain diffusion is biased to a high voltage and the source diffusion is grounded. The drain diffusion is the diffusion near the storage site to be programmed in a two storage site device. The storage site is a nitride region located below a control gate. In a two storage site device there are two control gates and two separate nitride regions. The unselected control gate is biased to a high voltage to override the highest possible threshold voltage of the memory storage region beneath the unselected control gate. The selected control gate is the control gate above the storage site to be programmed and is biased to a high voltage for electron injection into the nitride storage site. The source diffusion can be connected to a load device to limit and control cell current, and cell current can be controlled with a low word gate voltage. To control program disturb of the adjacent cell, the voltage of the unselected diffusion of the adjacent cell is increased slightly. Increasing the voltage of the unselected adjacent diffusion decreases the gate to source voltage as well as increases the threshold voltage of the adjacent storage region and protects the cell from program disturb.

In order to program a memory cell of the present invention a program verify operation is necessary to determine if the cell being programmed has reach a sufficient program voltage. To do this there is a minimum of one switch from the program operation to a program verify operation and back. There can be several switches between operations during the programming of a cell. If the voltages involved in the two operations are substantially dissimilar, there is considerable charging and discharging of the various connecting lines, which results in time delays. To minimize the time delays between the two operations the bit line voltages and the control gate voltages are made the same as much as possible during both program and program verify. Also one variation of program verify uses a "forward read" direction which puts the lower voltage on the diffusion opposite the selected nitride storage site. The "forward read" operation allows minimal charging and discharging of the bit lines and control gates. This forward read approach is most effective when the channel length under the nitride region is long and the threshold voltage reduction as a function of drain-source voltage, shown in FIG. 4b, is small.

In order to program verify a selected nitride region in a twin MONOS memory cell, the source and drain bit lines are equalized to a voltage that is half of the high drain voltage during program. At the same time, the selected control gate voltage is lowered slightly, and the word line is then raised to a higher voltage to allow the word gate channel to conduct. Finally, one of the two bit lines is pulled down to a lower voltage. A sense amplifier connected to the bit line monitors the other bit line with respect to a reference voltage; if the target nitride region has been programmed enough, the voltage will be maintained, otherwise it will also fall. Verify can be performed in both the forward and reverse directions by choosing which of the two bit lines to pull down, or connect to the sense amplifier.

Another program method is described in which program is performed by utilizing the capacitance of the BL. Due to the high injection efficiency of the channel hot electron (CHE) program for the twin MONOS memory, program can be sufficiently completed within a short time, by using the charge stored on the capacitance of the high voltage drain side bit line. Program verify is performed by utilizing capacitance of the BL and the coupling capacitance between the bit lines and the control gate lines in order to increase the threshold voltage range. First the appropriate voltages are applied to the control gate lines and bit lines for the program. The control gate lines and bit lines are then floated and the word line is raised to a low voltage to limit the program current. When the word line turns on, all channels between the source and drain are on, so that charge will flow between the two bit lines. However, the low voltage of the word line also limits the source bit line voltage. When the drain side bit line voltage falls past a certain point, injection will stop. In order to program verify, the word line is raised to a high voltage in order for both bit lines to equalize to a middle voltage. Thereafter, the bit line closest to the selected nitride region will be pulled down to a lower voltage. The threshold of the verify operation is determined by the control gate voltage of the selected side minus the lower bit line voltage.

The voltage of the opposite bit line may be monitored to determine whether the selected nitride region has been programmed enough such that the bit line voltage is maintained, and doesn't fall.

The program to program verify sequences described in the present invention may also be applied to high program bandwidth applications for storage of multiple threshold levels in a single nitride region.

BRIEF DESCRIPTION OF THE DRAWINGS

This invention will be described with reference to the accompanying drawings, wherein:

FIG. 1 is a method of prior art used to program and program verify a nonvolatile memory cell;

FIG. 2a is a diagram of a MONOS cell of prior art showing voltages for program;

FIG. 2b is a diagram of a MONOS cell of prior art showing voltages for program verification;

FIG. 3 is a diagram of a dual storage MONOS cell of prior art;

FIG. 4a is a diagram of a dual storage MONOS cell of prior art with dual control gates;

FIG. 4b is a graph showing the relationship between threshold voltage and drain-source voltage of a dual storage MONOS cell of prior art with dual control gates;

FIG. 4c is a schematic of an array of dual storage MONOS cells of prior art with dual control gates.

FIG. 5a is a diagram of a dual storage MONOS cell of the present invention showing voltages for a program operation of the first embodiment;

DETAILED DESCRIPTION OF THE PREFERRED EMBODIMENT

Figure 5B:
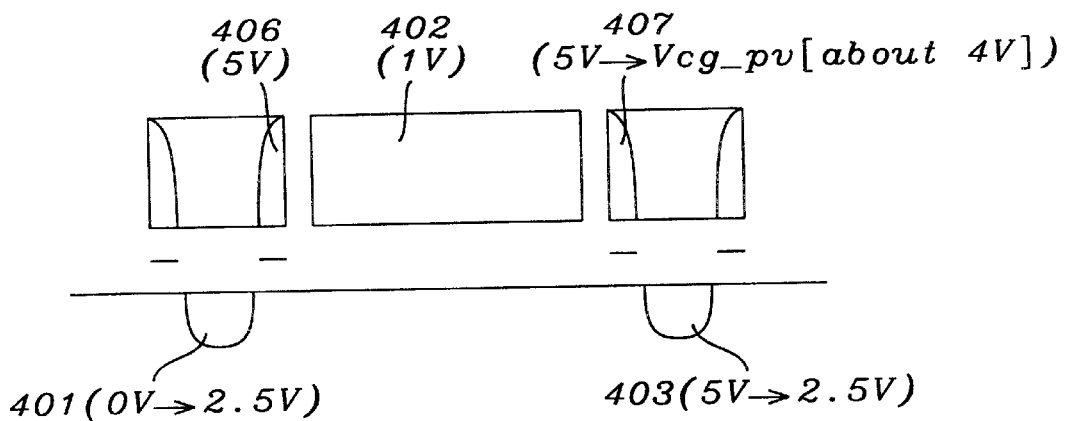
FIGS. 5b–d are diagrams of a dual storage MONOS cell of the present invention showing voltages for a program verify operation of the first embodiment.

Based on the memory cell structure in FIG. 4a, program and verify conditions for the twin MONOS memory cell of patent application Ser. No. 09/426,692, filed Oct. 25, 1999, are given in FIG. 5a through FIG. 5d. The memory cell 410 is comprised of one word gate 402, a left diffusion region 401, a right diffusion region 403, and two control gates 406 and 407, and two nitride storage sites 404 and 405. The left nitride storage site 404 is positioned under the left control gate 406, above the left diffusion 401, and close to the word gate 402. The right nitride storage site 405 is positioned under the right control gate 407, above the right diffusion 403, and close to the word gate 402.

It should be noted that the program condition shown are significantly lower than the program voltages for a conventional MONOS device. The voltage difference is due to the enhanced electron injection mechanism for the twin MONOS device. However, it should also be noted that the voltages shown are approximations only. The actual voltages need to be determined based on process and product specification factors such as threshold shift, oxide and ONO thickness, doping profiles, and the program and erase time specifications. It is assumed that the threshold for a "0" state is Vth>2.0V, the threshold for a "1" state is about 0.5V, and the word gate 503 threshold is 0.5V.

Based on the memory cross section of FIG. 4a, FIG. 5a shows the voltage conditions of the present invention, when the right nitride storage site is selected. In order to program to the right nitride storage site 405, an approximate 5V drain to source voltage is applied across the memory cell For CHE injection, the diffusion 403 closest to the selected storage site becomes the drain. Of the two diffusion regions 401 and 403, the right diffusion 403 is determined have the high drain voltage of about 5V, and the left diffusion 401 becomes the source, which is around 0V. A low word gate voltage of approximately 1V limits program cell current. The left control gate 406 is biased to a high voltage of approximately 5V to override a possible high threshold state in the unselected memory storage region 404. Although a program operation is still possible for a lower left control gate voltage of around 3V if the target program threshold is about 2.0V, the higher voltage of 5V is selected to be the same override voltage as used during program verify to reduce the transition time between program and program verify modes. The right control gate 407 is biased to 5V.

Figure 5C:
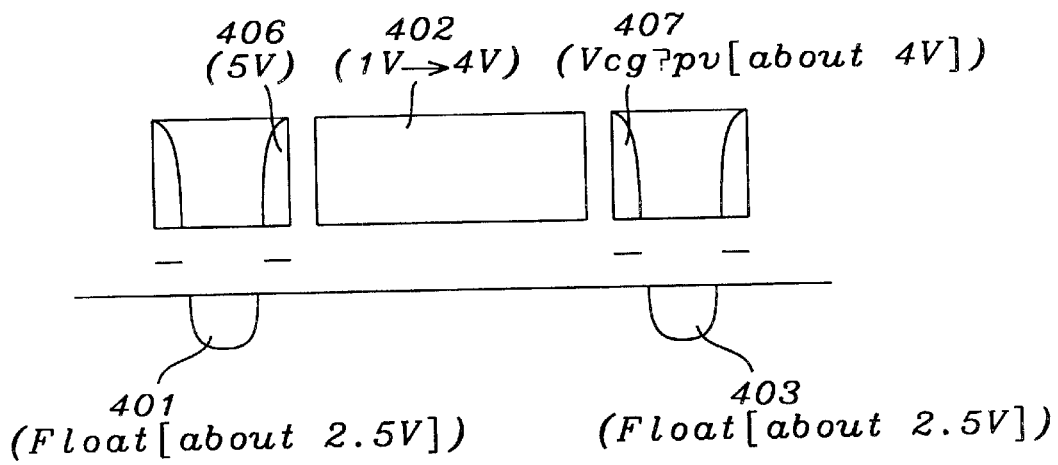
Figure 5D:
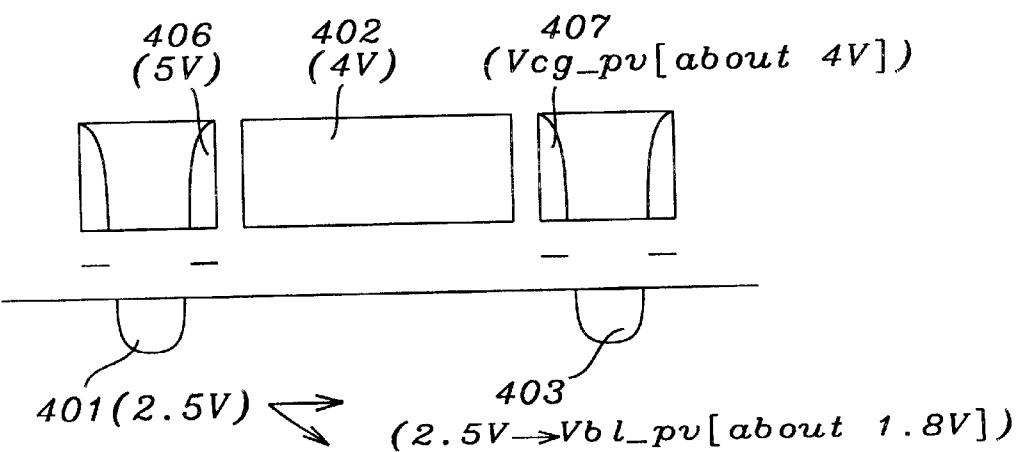

FIG. 5b gives the voltage conditions during transition between program and program verify mode. When switching between program and program verify mode, the high control gate voltages do not need to be discharged down to the low voltages for a normal read operation, which saves charge pump current and mode switching time. Instead, the control gate 406 remains near 5V. The source diffusion 401 and drain diffusion 403 is equalized to about 2.5V, which is half of the high drain voltage used for program. At the same time, the voltage of the right control gate 407 is changed to Vcg_pv, which is about 4V for a target threshold of 2.0V, when body effect is considered. After the voltages of both the left and right diffusion 401 and 403 have settled to 2.5, both diffusions are floated as shown in FIG. 5c. The word gate 402 is then raised to a high voltage of about 4V, in order to allow the diffusion voltages of 2.5V to pass easily. It is also possible to equalize the bit lines at the same time the word line is being raised. The final step of the program verify sequence is shown in FIG. 5d. The voltage of the right diffusion 403 is pulled down to Vbl_pv, which can be about 1.8V and the voltage of the left diffusion 401 is monitored. If the threshold of the right nitride region 405 is greater than the target 2.0V, then the left diffusion 401 voltage will remain at about 2.5V. Otherwise, if the threshold is lower than 2.0V, the left diffusion 401 voltage will fall. Because the lower of the two diffusion voltages is on the same side as the selected nitride region, the read direction is reverse read. The target program threshold voltage is determined by the voltage of Vcg_pv and the Vbl_pv, where Vtarget_threshold≈Vcg_pv−Vbl_pv, considering that the nonzero source-substrate voltage introduces a body effect component to Vtarget_threshold.

Figure 6:
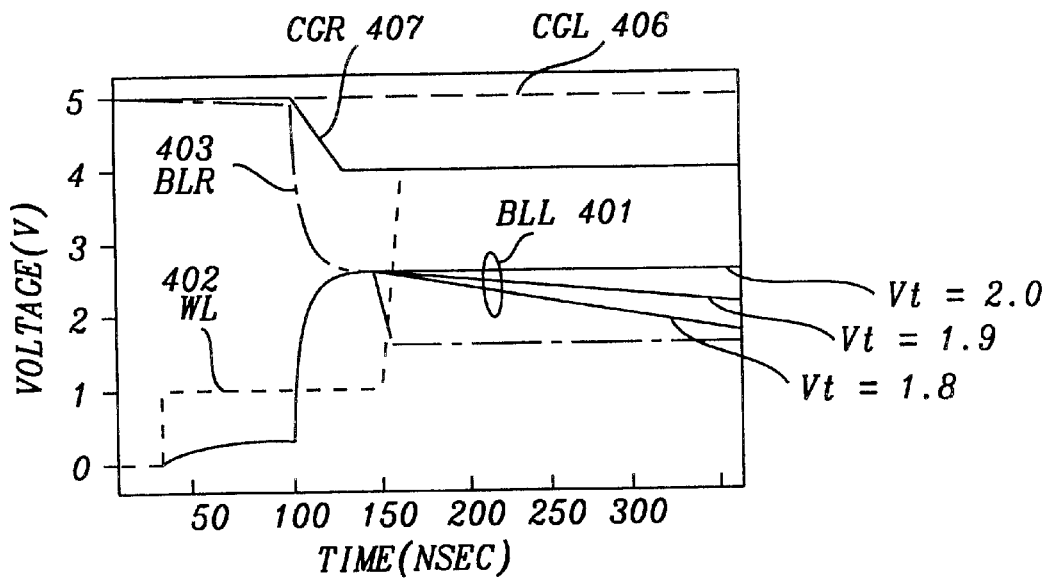
FIG. 6 is a diagram of simulation results for the program and program verify method of the first embodiment

FIG. 6 shows simulation results for the program verify sequence described by FIGS. 5a through d for the first embodiment. Shown are voltage curves versus time for the left control gate CGL 406, the right control gate CGR 407, the word gate WL 402, the left bit line BLL 401, and the right bit line BLR 403. The effects of threshold voltage are shown for the left bit line BLL 401.

Figure 7:
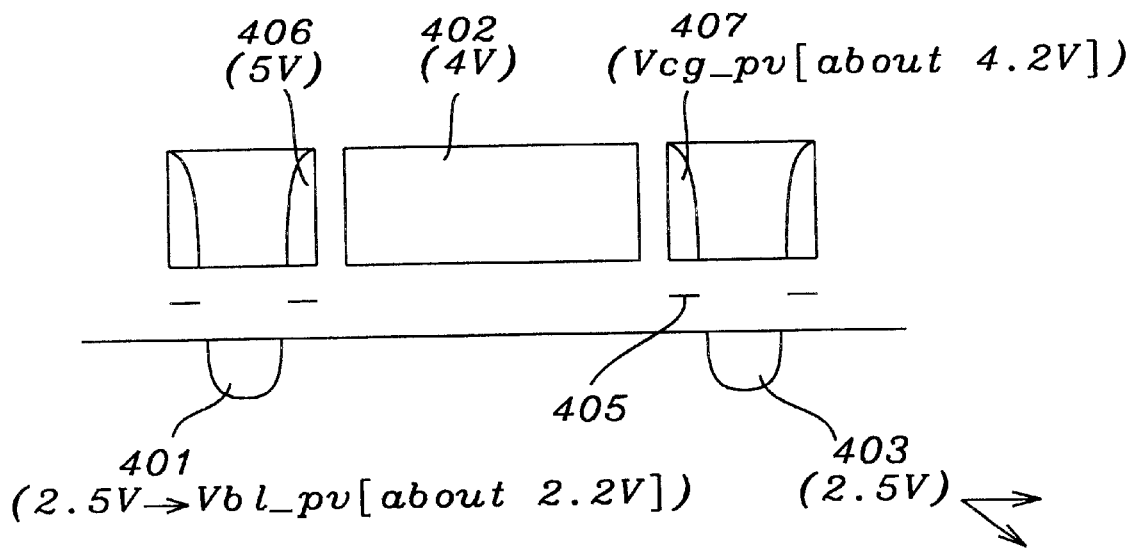
FIG. 7 is a diagram of a dual storage MONOS cell of the present invention showing voltages for a program verify operation of the second embodiment.

In a second embodiment of the present invention, program verify can be conducted in the forward read direction. The program and verify sequences shown in FIGS. 5*a* through *c* are the same. However, in the last step, the voltage conditions in FIG. 7 are substituted for those of FIG. 5*d*. In forward read, the source and drain diffusions swap compared to during reverse read. The voltage of the left diffusion 401 farther from the selected nitride 405 is pulled down to a voltage of Vbl_pv. The voltage of the right diffusion 403 closer to the selected nitride region 405 is monitored to determine the threshold value. If the selected nitride region 405 threshold is greater than 2.0V, then the right diffusion voltage 403 will be maintained. For forward read, threshold voltage degrades as a function of drain-source voltage, so it is important to keep the drain to source voltage to between 0.3 to 0.5V. In order to verify a target threshold of 2.0V, Vcg_pv should be 2.0V (plus some additional voltage to account for body effect) greater than the Vbl_pv.

Figure 8A:
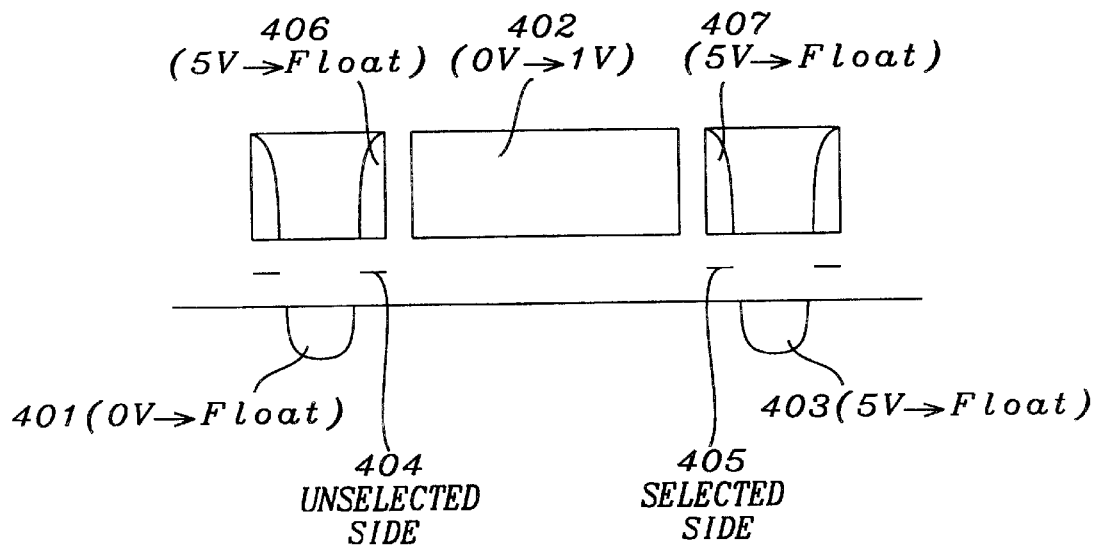
FIGS. 8a–b are diagrams of a dual storage MONOS cell of the present invention showing voltages for a program operation of the third embodiment.
Figure 8B:
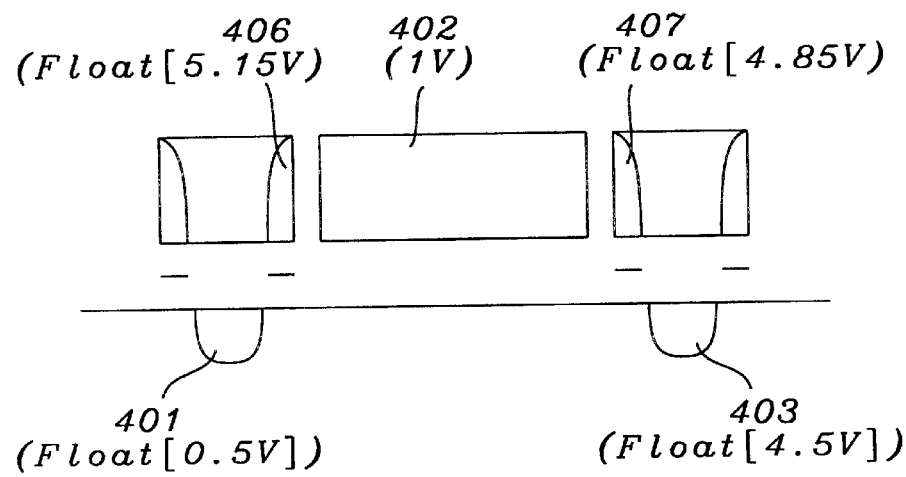
Figure 8C:
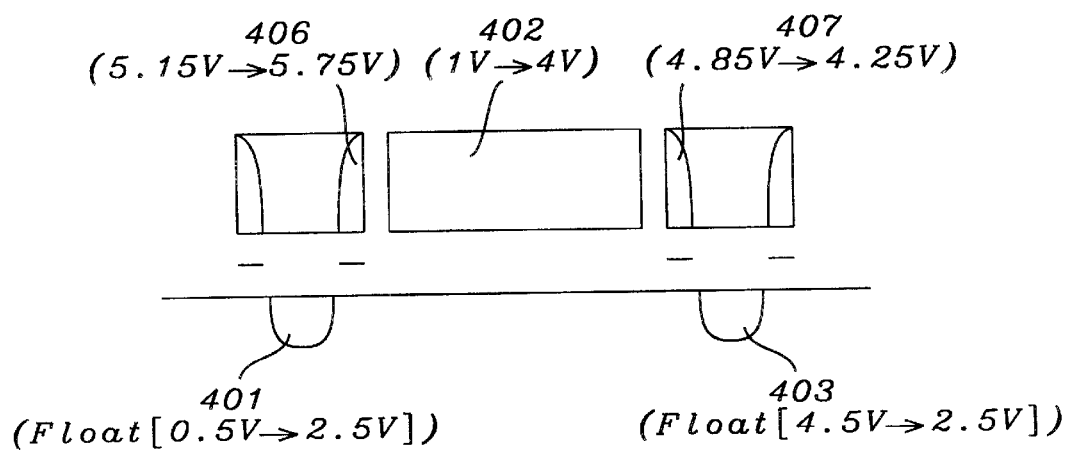
FIGS. 8c–d are diagrams of a dual storage MONOS cell of the present invention showing voltages for a program verify operation of the third embodiment.
Figure 8D:
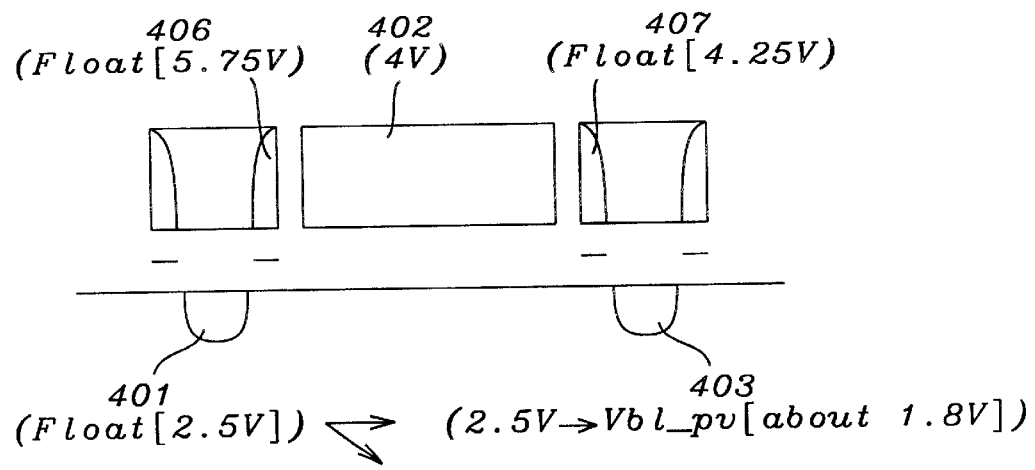

In a third embodiment of the present invention, the sequence for program is given in FIGS. 8*a* through *b*, and the program verify sequence is shown in FIGS. 8*c* through *d*.

FIG. 8*a* gives the voltage conditions in order to program the right nitride region 405 of the twin MONOS memory cell of FIG. 4*a*. The left control gate 406 is biased to an override voltage of about 5V. The right control gate 407 is biased to a selected program voltage of approximately 5V. The left diffusion 401 is grounded and the right diffusion 403 is raised to a high drain voltage of approximately 5V. After the bit lines and control gate lines which are connected to the respective diffusions 401 and 403, and control gates 406 and 407 of the selected memory cell have settled to their proper voltages, they are disconnected from their voltage supplies and are floated. The word line, which is connected to word gate 402, is then raised and program begins when electrons start to flow from the source bit line to the drain bit line. The high CHE injection efficiency of the twin MONOS cell of the present invention allows sufficient programming using the energy stored in the high drain voltage bit line, without actually DC biasing of the source and drain. The word line voltage also limits the extent of bit line equalization, because the source bit line will not rise past the voltage of the word line minus the threshold voltage of the word gate, which is approximately 0.5V. Thus, after the source bit line rises to 0.5V, and the drain bit line falls to 4.5V, charge will no longer flow between the two bit lines and so CHE injection will stop. Changes in the bit line voltages also affect the voltages of the two floating control gate lines. If we assume that the bit line to control gate line coupling ratio is about 30%, then a 0.5V bit line voltage change will result in a 0.15*0.3=0.15V control gate line voltage change. The bit line and control gate voltages after program has stopped are given in FIG. 8*b*.

In FIG. 8*c*, the word gate 402 voltage is raised to a higher voltage of about 4V in order to equalize the left and right bit lines to a middle voltage of approximately 2.5V and then floated. At the same time that the bit lines converge to 2.5V, the control gate voltages, which are capacitive coupled, such that the left control gate 406 rises to 5.75V and the right control gate 407 falls to 4.25V. This voltage of the right control gate 407 is equivalent to the Vcg_pv in the first embodiment of the present invention.

As shown in FIG. 8*d*, when the voltage of the right side diffusion 403 is pulled down to Vbl_pv, it is then possible to determine if the threshold of the selected nitride region is greater than the target threshold voltage Vtarget_threshold (where Vtarget_threshold≈Vcg_pv−Vbl_pv), by monitoring the bit line connected to the left diffusion 404. If the voltage is maintained, or remains higher with respect to a given voltage, then programming is sufficient, otherwise the voltage of the left diffusion 404 will fall.

The advantage of the third embodiment over the first embodiment is that Vcg_pv does not have to be externally applied to the memory cell. Instead, it can be derived by a unique timing sequence and utilizing the capacitive coupling between the bit line and control gate line.

Figure 9:
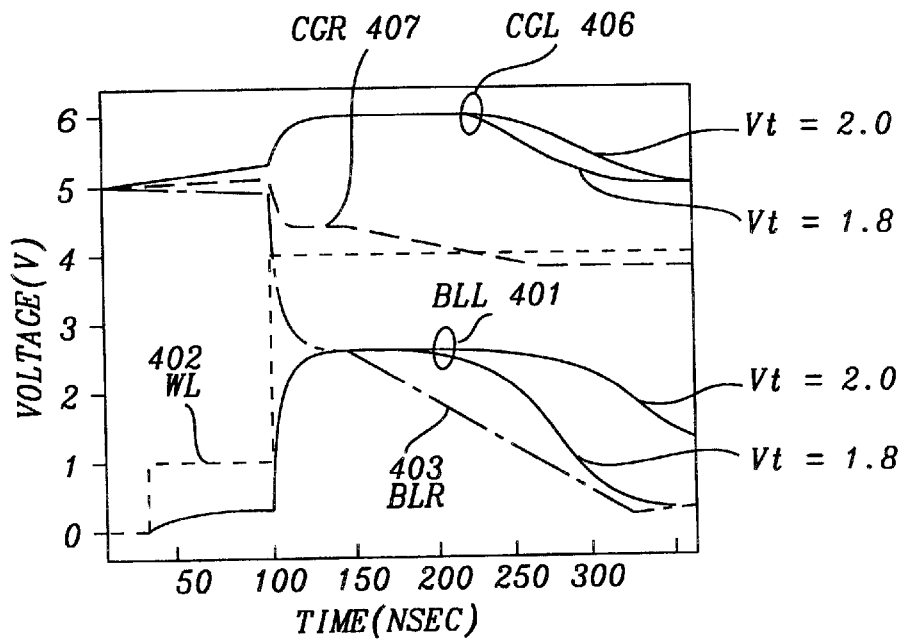
FIG. 9 is a diagram of simulation results for the program and program verify method of the third embodiment.

FIG. 9 shows simulation results for the program verify sequence described by FIG. 8*a* through *d* for the third embodiment. Shown are voltage curves versus time for the left control gate CGL 406, the right control gate CGR 407, the word gate WL 402, the left bit line BLL 401, and the right bit line BLR 403. The effects of threshold voltage are shown for the left bit line BLL 401 and the left control gate 406.

The first and third embodiments of the present invention may be applied to high program bandwidth applications for storage of multiple threshold levels in a single nitride region. By applying the formula Vtarget_threshold≈Vcg_pv−Vbl_pv, the desired threshold can be tightly controlled. (Note: body effect due to source-substrate bias needs also needs to be considered) Based on the simulation data of FIG. 6 and FIG. 9, threshold voltage increments of less than 0.1V can be resolved by setting the values of Vcg_pv or Vbl_pv, or both.

In the first, second and third embodiments, during the program verify sequence, it is also possible to equalize the bit lines using another transistor, which can be connected between the left and right bit lines. The gate of this transistor could be activated during the equalization phase and deactivated at all other times.

In the first, second, and third embodiments, program verify time can be reduced by setting Vcg_pv−Vbl_pv>Vtarget_threshold. Both the insufficiently programmed bit line and the sufficiently programmed bit line voltages will fall, however it is possible to distinguish between the two cases by comparing the bit line voltage to a reference voltage or reference cell. If the bit line fall remains above the reference voltage within a given time interval, then the cell has been programmed enough.

Figure 10:
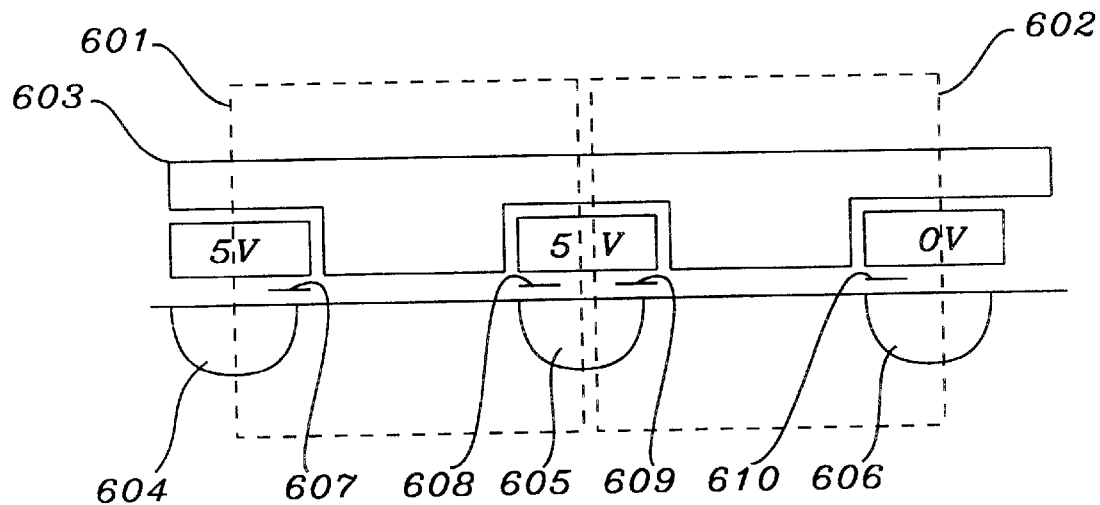
FIG. 10 is a diagram of two adjacent dual storage MONOS cells of the present invention.

In another embodiment of the present invention, during program, the adjacent cell is protected from program disturb by raising slightly the voltage of the opposite diffusion. FIG. 10 shows a cross-section of two adjacent memory cells 601 and 602. When the right selected memory storage region 608 of the left cell 601 is to be to be programmed, the adjacent memory storage region 609 in the adjacent cell 602, sharing the same high voltage control gate and high voltage diffusion 605, is in danger of program disturb. If the opposite right side memory storage region 610 in the right cell 602 has a negative threshold, it is possible that the adjacent right cell 602 may conduct current, thereby programming the memory storage region 609 of the unselected adjacent cell. In order to protect unselected adjacent memory cell storage region 609 from program disturb, the unselected adjacent diffusion 606 is biased to a slightly high voltage, approximately 1V. Increasing the voltage of the unselected adjacent diffusion 606 effectively increases the threshold of the memory storage region 610, as well as raises the source voltage of the cell. It is important that this diffusion voltage not be too high, or program disturb may propagate to the adjacent cell of the adjacent cell of 601. In another embodiment of the present invention, during program, the current of the memory cell is controlled by connecting a current load transistor to the left source diffusion 401.

While the invention has been particularly shown and described with reference to preferred embodiments thereof, it will be understood by those skilled in the art that various changes in form and details may be made without departing from the spirit and scope of the invention.

What is claimed is:

1. A method of programming a dual storage site MONOS memory cell using bit line capacitance to provide charge during CHE programming, comprising:

a) biasing a first control gate located above an unselected storage site of a MONOS memory cell to a first high voltage, b) biasing a second control gate located above a selected storage site of said memory cell to a second high voltage, c) biasing a first diffusion below said first control gate to zero volts, d) biasing a second diffusion below said second control gate to a third high voltage e) biasing a word gate of said memory cell to zero volts, then f) floating said first and second control gates and said first and second diffusions, then g) increasing said word gate voltage to a predetermined value, then h) programming said selected storage site with a flow of electrons between said first and second diffusions.

2. The method of claim 1, wherein biasing said second diffusion provides a charge on a bit line coupled to said second diffusion that produces said flow of electrons between said first and second diffusions when said word gate voltage is increased.

3. The method of claim 2, wherein said flow of electrons between said first and second diffusions programs said selected storage site with CHE injection.

4. The method of claim 3, wherein said word gate voltage limits the extent of equalization between first and second diffusions and prevents said flow of electrons when the first diffusion reaches a voltage equal to said word gate voltage minus a threshold voltage of said word gate.

5. The method of claim 1, wherein said first diffusion is a source and said second diffusion is a drain.

* * * * *